(12) United States Patent
Mitani et al.

(10) Patent No.: US 6,512,183 B2
(45) Date of Patent: Jan. 28, 2003

(54) ELECTRONIC COMPONENT MOUNTED MEMBER AND REPAIR METHOD THEREOF

(75) Inventors: Tsutomu Mitani, Hyogo (JP); Hiroaki Takezawa, Nara (JP); Yukihiro Ishimaru, Osaka (JP); Takashi Kitae, Osaka (JP); Yasuhiro Suzuki, Shizuoka (JP)

(73) Assignee: Matsushita Electric Industrial Co., Ltd., Kadoma (JP)

(*) Notice: Subject to any disclaimer, the term of this patent is extended or adjusted under 35 U.S.C. 154(b) by 0 days.

(21) Appl. No.: 09/893,106

(22) Filed: Jun. 27, 2001

(65) Prior Publication Data

US 2002/0062988 A1 May 30, 2002

(30) Foreign Application Priority Data

Oct. 10, 2000 (JP) ........................................ 2000-309693

(51) Int. Cl.⁷ ................................................. H05K 1/09
(52) U.S. Cl. ........................ 174/257; 174/260; 174/259; 361/768; 361/771
(58) Field of Search ................................ 174/260, 257, 174/258, 259; 361/767, 758, 771

(56) References Cited

U.S. PATENT DOCUMENTS

| | | | | |
|---|---|---|---|---|
| 5,315,486 A | * | 5/1994 | Fillion et al. ................ | 174/253 |
| 5,579,573 A | * | 12/1996 | Baker et al. ................. | 174/259 |
| 5,714,252 A | * | 2/1998 | Hogerton et al. ............ | 174/255 |
| 5,888,884 A | * | 3/1999 | Wojnarowski .............. | 438/460 |
| 5,972,246 A | * | 10/1999 | Nikaidoh et al. ........... | 174/257 |
| 6,284,573 B1 | * | 9/2001 | Farnworth ................... | 438/110 |
| 6,297,559 B1 | * | 10/2001 | Call et al. ............... | 228/180.22 |
| 6,395,998 B1 | * | 5/2002 | Farquhar et al. ............ | 174/252 |
| 6,429,511 B2 | * | 8/2002 | Ruby et al. ................. | 257/685 |

FOREIGN PATENT DOCUMENTS

| | | |
|---|---|---|
| EP | 1 041 616 | 10/2000 |
| JP | 2-182050 | 7/1990 |
| JP | 5-74857 | 3/1993 |
| JP | 5-275489 | 10/1993 |
| JP | 9-148720 | 6/1997 |
| JP | 9-204816 | 8/1997 |
| JP | 11-224891 | 8/1999 |

* cited by examiner

*Primary Examiner*—Albert W. Paladini
*Assistant Examiner*—José H. Alcalá
(74) *Attorney, Agent, or Firm*—Merchant & Gould P.C.

(57) ABSTRACT

An electronic component mounted member includes a circuit board, an electronic component connected to the circuit board and an electrically conductive adhesive interposed between the electronic component and the circuit board. In a joining interface of the electrically conductive adhesive and an electrode of the circuit board, an intermediate layer that is formed of a thermoplastic insulating adhesive with a softening temperature of 100° C. to 300° C. is interposed between the electrically conductive adhesive and the electrode. An electrically conductive filler contained in the electrically conductive adhesive is present partially in the intermediate layer, thus allowing an electrical conduction between the electrically conductive adhesive and the electrode of the circuit board. This electronic component mounted member is used, and when a repair is necessary, a portion of the intermediate layer corresponding to the electronic component to be repaired is heated so as to raise a temperature of this portion to at least a melting point of the thermoplastic insulating adhesive, thereby melting the thermoplastic insulating adhesive. Then, the electronic component is removed with this state maintained.

15 Claims, 3 Drawing Sheets

ELECTRONIC COMPONENT MOUNTED MEMBER AND REPAIR METHOD THEREOF

BACKGROUND OF THE INVENTION

1. Field of the Invention

The present invention relates to an electronic component mounted member in which an electronic component and a circuit board are joined via an electrically conductive adhesive, in the field of mounting electronic components, and to an electronic component mounted member and a repair method thereof permitting improved repair of the component.

2. Description of Related Art

With an increasing attention to environmental issues recently, lead in a solder alloy has begun to be regulated in the field of electronics mounting. Accordingly, there has been an urgent demand for a joining technique for mounting the electronic components using no lead. As the lead-free mounting technique, in general, a lead-free solder and an electrically conductive adhesive can be considered. Because of expected advantages such as flexibility of a joining portion and a lower mounting temperature, the electrically conductive adhesive has attracted more attention.

Generally, the conventional electrically conductive adhesive is formed by dispersing an electrically conductive filler into a resin-based adhesive component. After a terminal of an electronic component and that of a circuit board are connected via the electrically conductive adhesive, the resin is cured, thereby maintaining a conduction of the connected portions by a contact of the electrically conductive fillers. Thus, since the connected portions are adhered to each other by the resin, there are advantages in that it is possible to respond flexibly to heat and deformation due to an external force and it is less likely to generate cracks in the connected portions compared with the solder, where the connected portions are adhered by an alloy. Consequently, the electrically conductive adhesive is expected as an alternative material to the solder.

However, in the conventional electronic component mounted member, once the electrically conductive adhesive is cured in a manufacturing process of the electronic component, it becomes difficult to remove, in other words, to repair the electronic component. This sometimes serves as an obstacle to the practical use of the electrically conductive adhesive. More specifically, for the purpose of obtaining a connection strength of the component, a thermosetting epoxy binder resin often is used for a binder resin of the electrically conductive adhesive. In this case, since the electronic component is removed forcibly by twisting, even after the component is removed, the electrically conductive adhesive remains on a substrate electrode. In an alternative case, there also are problems that the substrate electrode is peeled off from a substrate base material, or neighboring components are damaged.

In addition, some electrically conductive adhesives using thermoplastic binder resins are just becoming commercially-available as an electrically conductive adhesive that is capable of repair. However, such electrically conductive adhesives do not have a sufficient connection strength, and are, therefore, insufficient for a material for mounting electronic components. Also, although a mixture of the thermoplastic binder resin and the thermosetting binder resin has a better connection strength than the electrically conductive adhesive of the thermoplastic binder resin alone, the binder resin forms a lump and remains on a surface of the substrate electrode, so that, after the removal of the electronic component, a mounting work of a replacement electronic component becomes complicated.

As described above, in the mounted member of the electronic component and the circuit board via the conventional electrically conductive adhesive, it has been difficult to achieve both excellent repair characteristics and high connection strength of the electronic component.

SUMMARY OF THE INVENTION

With the foregoing conventional problems in mind, in a mounted member of an electronic component and a circuit board via an electrically conductive adhesive instead of solder, it is an object of the present invention to provide an electronic component mounted member and a repair method thereof having high repair characteristics as well as an improved connection strength of the electronic component and the circuit board.

In order to achieve the above-mentioned object, a first electronic component mounted member of the present invention includes a circuit board, an electronic component connected to the circuit board, and an electrically conductive adhesive interposed between the electronic component and the circuit board. In a joining interface of the electrically conductive adhesive and an electrode of the circuit board, an intermediate layer that is formed of a thermoplastic insulating adhesive with a softening temperature of 100° C. to 300° C. is interposed between the electrically conductive adhesive and the electrode. An electrically conductive filler contained in the electrically conductive adhesive is present partially in the intermediate layer, thus allowing an electrical conduction between the electrically conductive adhesive and the electrode of the circuit board.

Next, a second electronic component mounted member of the present invention includes a circuit board, an electronic component connected to the circuit board, and an electrically conductive adhesive interposed between the electronic component and the circuit board. In a joining interface of the electrically conductive adhesive and an electrode of the circuit board, an intermediate layer that is formed of a thermoplastic insulating adhesive with a softening temperature of 100° C. to 300° C. and contains an electrically conductive expandable particle is interposed between the electrically conductive adhesive and the electrode. The electrically conductive expandable particle allows an electrical conduction between the electrically conductive adhesive and the electrode of the circuit board.

Furthermore, a repair method of an electronic component mounted member of the present invention includes using the mounted member including a circuit board and an electronic component connected to the circuit board, and when a repair is necessary, heating a portion of the intermediate layer corresponding to the electronic component to be repaired so as to raise a temperature of this portion to at least a melting point of the thermoplastic insulating adhesive, thereby melting the thermoplastic insulating adhesive, and removing the electronic component with this state maintained.

DESCRIPTION OF THE PREFERRED EMBODIMENTS

Figure 1:
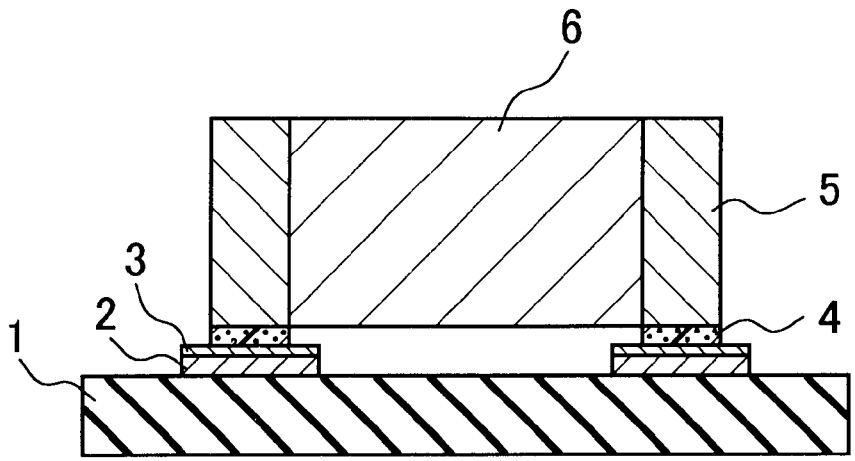
FIG. 1 shows a cross-section of an electronic component mounted member according to an example of the present invention.

The present invention is directed to an electronic component mounted member and a repair method thereof, in which an intermediate layer formed of an insulating adhesive with a specific softening temperature ranging from 100° C. to 300° C. is formed between an electrically conductive adhesive and an electrode of a circuit board.

In the electronic component mounted member in which the intermediate layer with a specific softening temperature is interposed between the electrically conductive adhesive and the circuit board electrode, when a repair is necessary, by heating the corresponding portion of the electronic component by spot-heating (heating only a portion that needs repairing) such as a hot air or an infrared ray so as to raise the temperature thereof to at least its melting point, the intermediate layer melts. Then, with this state maintained, the electronic component can be grasped and removed easily.

In the present invention, it is preferable that the area where the intermediate layer is formed is not smaller than that where the electrically conductive adhesive is formed. Furthermore, it is preferable that the area where the intermediate layer is formed is one to two times as large as that the electrically conductive adhesive is formed. It is particularly preferable that the former is 1.1 times to 1.5 times as large as the latter.

It is preferable that the intermediate layer of the present invention has a thickness of 0.05 $\mu$m to 10 $\mu$m. In the case where the thickness falls within this range, when the electronic component is mounted, the intermediate layer is broken partially by a pressure of an electrically conductive metal filler contained in the electrically conductive adhesive, thus allowing an electrical conduction between the electrically conductive adhesive and the circuit board electrode. If the intermediate layer is thinner than 0.05 $\mu$m, it may be difficult to form the intermediate layer on the entire surface of the connected portion uniformly. On the other hand, if it is thicker than 10 $\mu$m, a material cost and a process cost in terms of a formation time tend to increase. Moreover, the intermediate layer may become difficult to be broken, leading to a poor electrical conduction between the electrically conductive adhesive and the circuit board electrode.

On the portion of the circuit board electrode from which the electronic component has been removed as above, the electrically conductive adhesive is formed again, and an alternative electronic component is mounted, followed by curing the electrically conductive adhesive. In this manner, it becomes possible to obtain an excellent electronic component mounted member.

It is preferable that a thermoplastic insulating adhesive with a specific softening temperature of the present invention is a substance having a melting point that is higher than a curing temperature of the electrically conductive adhesive and does not easily damage the circuit board and electronic components mounted on the periphery of the electronic component to be repaired. For example, the thermoplastic insulating adhesive may be thermoplastic epoxy resin, acrylic resin or vinyl resin. In general, since the softening temperature of polymers is slightly (more specifically, a few degrees) lower than their melting point, the softening temperature substantially can be regarded as the melting point.

In the present invention, an electrically conductive expandable particle that expands at a specific temperature may be mixed in the insulating adhesive. The insulating adhesive mixed with the electrically conductive expandable particle expands when it is heated to the temperature equal to or higher than an expansion temperature of this expandable particle. When the electronic component mounted member of the present invention obtained by interposing such insulating adhesive layer between the electrically conductive adhesive and the circuit board electrode is heated to maintain the expansion temperature, the insulating adhesive layer expands, making a repair easier. The electrically conductive expandable particle is a substance having a preferable expansion temperature that is higher than the curing temperature of the electrically conductive adhesive and the softening temperature of the cured electrically conductive adhesive and low enough not to easily damage components other than the component to be repaired or the circuit board. The content of the electrically conductive expandable particle preferably is from 2 vol % to 50 vol %, and more preferably is from 5 vol % to 20 vol %. The content less than 2 vol % may not lead to a notable effect of adding the electrically conductive expandable particle, while that more than 50 vol % may bring about a lower connection strength, which is not preferable in practice. Also, it is preferable that the electrically conductive expandable particle has a mean particle diameter of 1 $\mu$m to 10 $\mu$m. The electrically conductive expandable particle may be an expandable resin whose surface is coated with metal such as gold, and therefore is electrically conductive in itself.

Also, it is preferable that the intermediate layer has a thickness that does not have a harmful effect on the electrical connection by the electrically conductive adhesive between the electronic component and the circuit board electrode in practice. The thickness of the intermediate layer is, for example, approximately the same or less than the size of the electrically conductive filler contained in the electrically conductive adhesive. In particular, the intermediate layer has a thickness of 0.05 $\mu$m to 10 $\mu$m. If the intermediate layer is thinner than 0.05 $\mu$m, a binder resin component of the electrically conductive adhesive may adhere directly to the circuit board electrode, making it difficult to achieve an excellent repair. On the other hand, if it is thicker than 10 $\mu$m, it may become difficult to maintain a good contact between the electrically conductive filler and the circuit board electrode, increasing the connection resistance.

In addition, in a connected portion of the electronic component and the circuit board electrode, when the area where the insulating adhesive resin is formed is made larger than that where the electrically conductive adhesive is formed, such electronic component mounted member can achieve an excellent repair easily.

The following is a description of the present invention, with reference to the accompanying drawings. FIG. 1 shows a schematic structure of an electronic component mounted member in which electrodes 5 of an electronic component 6 and electrodes 2 of a circuit board 1 are connected to each other via electrically conductive adhesives 4 and intermediate layers (insulating adhesive resin) 3. When the area where the electrically conductive adhesive 4 is formed is larger than that where the intermediate layer (insulating adhesive) 3 is formed so that the electrically conductive adhesive 4 directly contacts the circuit board 1 or the electrode 2, the effect of the intermediate layer (insulating adhesive resin layer) 3 is not fully expressed because of poor repair characteristics of the electrically conductive adhesive 4. Also, at the time of repairing, a binder resin component of the electrically conductive adhesive 4 remains on the circuit board 1 or the electrode 2. Thus, in the present invention, it is preferable that the formed area of the electrically conductive adhesive 4 and that of the intermediate layer (the insulating adhesive resin) 3 achieve the above relationship. In other words, a chip resistor 6 having terminal electrodes 5 is electrically connected onto the electrodes 2 of the circuit board 1 provided with the intermediate layers 3 of an electrically conductive medium preferable for a repair of the present invention via the electrically conductive adhesives 4.

Figure 6A:
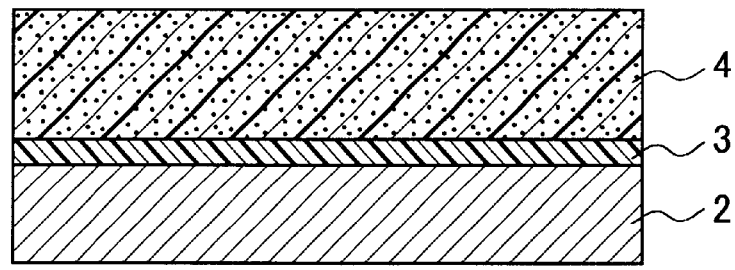
FIG. 6A shows a schematic cross-section for describing an electrical connection more specifically in an example of the present invention.
Figure 6B:
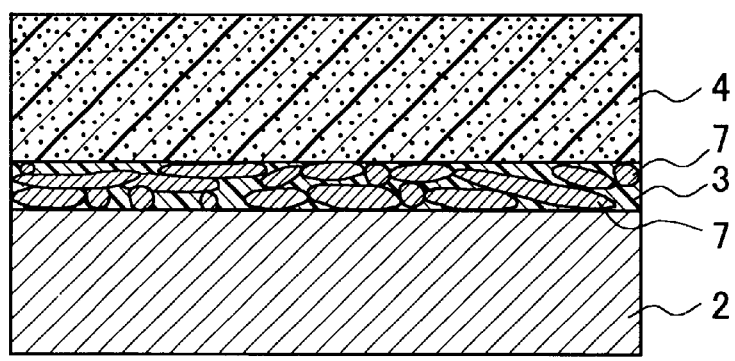
FIG. 6B shows a schematic cross-section of the enlarged electrically connected portion in FIG. 6A.

FIGS. 6A and 6B show schematic cross-sections for more specifically describing the electrical connection mentioned above. In FIG. 6A, the electrically conductive adhesive 4 and the intermediate layer (the insulating adhesive resin) 3 are interposed and connected between the electrode 2 formed on the surface of the circuit board and the electrode (not shown in this figure) of the electronic component, so as to form the mounted member. The electrically connected portion of FIG. 6A is enlarged and shown in FIG. 6B. An electrically conductive filler 7 in the electrically conductive adhesive 4 penetrates the intermediate layer 3 so as to contact the substrate electrode 2, thus conducting electricity. This process is explained as follows. After forming the intermediate layer 3 on the surface of the substrate electrode 2, the electrically conductive adhesive 4 is formed by printing. Thereafter, when the electronic component is mounted, the electrically conductive adhesive 4 also is pressed by a mounter, so that the electrically conductive filler 7 in the electrically conductive adhesive 4 cuts into the intermediate layer 3. As a result, the substrate electrode 2 and the electrically conductive filler 7 contact each other. In order to improve this electrical conduction, it is preferable that the relationship between the thickness of the intermediate layer and the diameter of the electrically conductive filler is selected appropriately.

Also, in the present invention, the above-described insulating adhesive resin with a specific softening temperature may be formed on the surface of the electrode of the circuit board and/or the surface of the circuit board. The circuit board with such a structure is appropriate for realizing the repair method of the present invention mentioned above.

According to the electronic component mounted member of the present invention, it is possible to solve the conventional problem of repairing in the mounting technique of the electronic components using the electrically conductive adhesive and achieve a repair of substantially the same degree as that of the conventional soldering connection without using such solder connection.

In the present invention, the intermediate layer with a specific softening point is formed on a joining interface of the electronic component and the circuit board, thus making it possible to improve repair characteristics of the electronic components practically, which conventionally have been a problem in the connection with the electrically conductive adhesive. Furthermore, the present invention can achieve an electronic component and an electronic component mounted member using no lead. This also is appropriate for responding to environmental issues, which have attracted wide attention recently.

Evaluation methods in the following examples are now explained.

In a condition where a warm air jet with a temperature of 220° C. is blown against the chip resistor 6 from 5 cm above it, the chip resistor is clamped by a pincher-shaped jig that is directly connected to a load cell and raised vertically upward so as to observe and evaluate the strength of the chip resistor at the time of its removal and a surface condition of the substrate electrode when the chip resistor is removed successfully.

EXAMPLE 1

Figure 2:
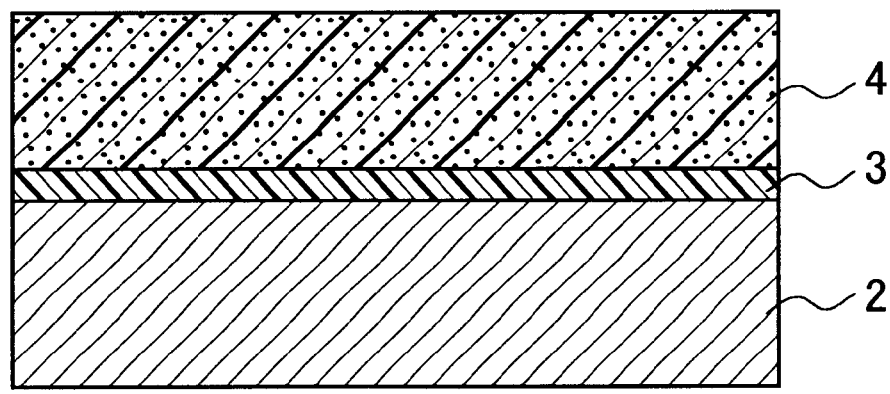
FIG. 2 shows a cross-section of a connected portion of an electronic component mounted member in which an acrylic resin is used for an intermediate layer according to Example 1 of the present invention.

FIG. 2 shows a schematic cross-section of a connected portion when the chip resistor (not shown in this figure) was connected to the circuit board using the electrically conductive adhesive 4 in the above-described basic structure of the present invention shown in FIG. 1. In other words, the intermediate layer 3 of a thermoplastic insulating adhesive with a softening point of 150° C. was formed on the surface of the electrode 2 of the circuit board. The intermediate layer 3 was formed by spray coating a solution in which acrylic resin (acrylic adhesive, manufactured by Toyobo Co., Ltd.) was dissolved in an alcoholic solvent (ethanol) in the resin-ethanol ratio of 10 wt % : 90 wt %. The thickness after drying is shown in Table 1. The formed area of the intermediate layer was 7.6 mm$^2$ (2.0 mm×3.8 mm), and that of the electrically conductive adhesive was 6.12 mm$^2$ (1.8 mm×3.4 mm).

As the electrically conductive adhesive 4, a thermosetting epoxy resin-based electrically conductive adhesive containing 80 vol % of mercury as a electrically conductive filler was used. A glass epoxy substrate was used as the base material of the circuit board.

As shown in FIG. 2, the prepared chip resistor was mounted on the circuit board 1 using the electrically conductive adhesive 4 and cured in an oven at 150° C. for one hour. Such electronic component mounted members were produced with various specifications of the intermediate layers 3, and their repair characteristics were evaluated.

Also, as Reference example 1, the mounted member without any intermediate layer 3 was produced in a similar manner, so as to evaluate its repair characteristics. The results are shown in Table 1.

TABLE 1

| Experiment No. | Intermediate layer specification | Surface condition after component removal | | Component removal load (N) |
| --- | --- | --- | --- | --- |
| | | Adhesive residue | Damage | |
| Example 1-1 | Acrylic resin 0.03 µm | Small amount | Substrate electrode peel off | 13.9 |
| Example 1-2 | Acrylic resin 0.05 µm | None | None | 9.2 |
| Example 1-3 | Acrylic resin 0.5 µm | None | None | 8.5 |

TABLE 1-continued

| Experiment No. | Intermediate layer specification | Surface condition after component removal | | Component removal load (N) |
|---|---|---|---|---|
| | | Adhesive residue | Damage | |
| Example 1-4 | Acrylic resin 5 μm | None | None | 7.0 |
| Example 1-5 | Acrylic resin 10 μm | None | None | 6.5 |
| Example 1-6 | Acrylic resin 13 μm | None | None | 6.4 |
| Reference example 1 | No intermediate layer | Large amount | Substrate electrode peel off, component crack | 18.8 |

As shown in Table 1, in the example of the present invention, an excellent repair became possible.

EXAMPLE 2

Figure 3:
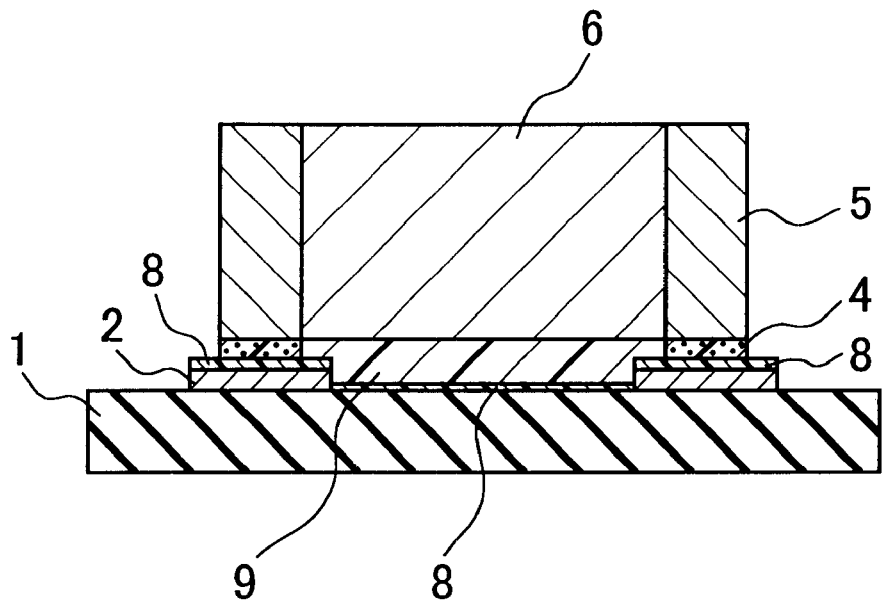
FIG. 3 shows a cross-section of a connected portion of an electronic component mounted member in which an acrylic resin is used for an intermediate layer and an adhesion of an electronic component is reinforced by an insulating adhesive according to Example 2 of the present invention.

As shown in FIG. 3, in the above-described basic structure of the present invention shown in FIG. 1, the surface of the electrode 2 of the circuit board and the surface of the circuit board 1 first were plated with solder having a thickness of 0.5 μm, and then an intermediate layer 8 further was formed thereon by spray coating an alcoholic solvent containing the same acrylic resin (softening point: 150° C.) as that in Example 1 as a binder component, so as to obtain a thickness after drying of 0.5 μm. The formed area of the intermediate layer 8 was 7.6 mm² (2.0 mm×3.8 mm), and that of the electrically conductive adhesive was 6.12 mm² (1.8 mm×3.4 mm).

Next, the chip resistor 6 was connected to the circuit board using the electrically conductive adhesive 4 and an electrically insulating adhesive 9 for reinforcement. The electrically conductive adhesive had the effects of an electrical connection and an adhesion, while the insulating adhesive 9 had the effect of reinforcing the adhesion. An epoxy adhesive (Amicon C-990J #330, manufactured by EMERSON & CUMING Inc.) was used as the electrically insulating adhesive 9.

The electrically conductive adhesive 4 used in this example was the same as that in Example 1. As shown in FIG. 3, the prepared chip resistor 6 was mounted on the circuit board 1 using the electrically conductive adhesive 4 and cured in an oven at 150° C. for one hour. The repair characteristics of this electronic component mounted member were evaluated.

Also, as Reference example 2, the intermediate layer 3 was formed by solder plating to obtain a thickness of 0.5 μm, so as to achieve the relationship of the formed area of the intermediate layer <that of the electrically conductive adhesive. The formed area of the intermediate layer was 7.6 mm² (2.0 mm×3.8 mm), and that of the electrically conductive adhesive was 9.66 mm² (2.3 mm×4.2 mm). The results are shown in Table 2.

TABLE 2

| Intermediate layer specification | Surface condition after component removal | | Component removal load (N) | Connection strength before repairing (N) |
|---|---|---|---|---|
| | Adhesive residue | Damage | | |
| (Example 2) Solder plating 0.5 μm + adhesive 0.5 μm | None | None | 9.3 | 43.5 |
| (Reference example 2) Solder plating 0.5 μm | None | None | 8.5 | 20.1 |

As shown in Table 2, in the example of the present invention, it became possible to achieve an excellent repair and to improve considerably the connection strength of the component in a normal state, i.e., in the completed form as the mounted substrate.

EXAMPLE 3

Figure 4:
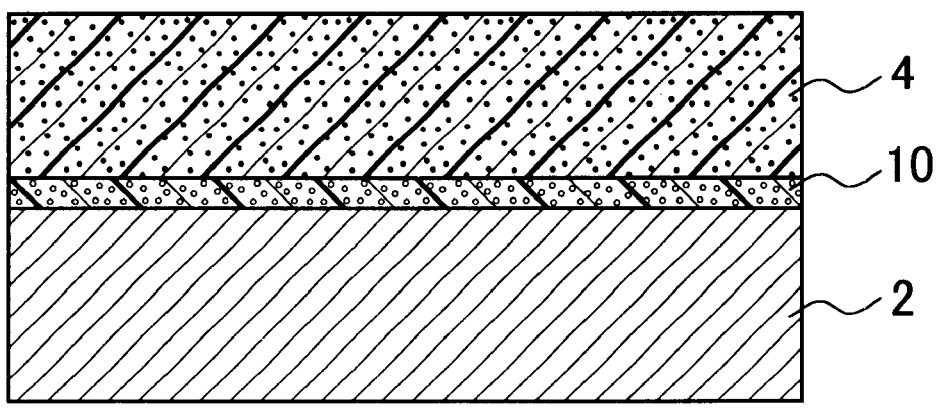
FIG. 4 shows a cross-section of a connected portion of an electronic component mounted member in which an acrylic resin layer containing a gold-plated expandable particle is used for an intermediate layer according to Example 3 of the present invention.

FIG. 4 shows a schematic cross-section of a connected portion when the chip resistor was connected to the circuit board using the electrically conductive adhesive 4 in the above-described basic structure of the present invention shown in FIG. 1. In this example, the surface of an expandable particle called F-80VS, manufactured by MATSUMOTO YUSHI-SEIYAKU Co., Ltd., (whose particle diameter is 6 μm to 10 μm) was plated with gold having a thickness of about 0.05 μm by an electroless deposition so as to be provided with an electrical conductivity. An intermediate layer 10 of a thermoplastic insulating adhesive with a specific melting point containing the electrically conductive expandable particle was formed on the surface of the electrode 2 of the circuit board by spray coating a solution in which the same acrylic resin as in Example 1 (solid blending quantity: 10 wt %) containing the above filler (blending quantity: 15 vol %) was dissolved in an alcoholic solvent.

Figure 5:
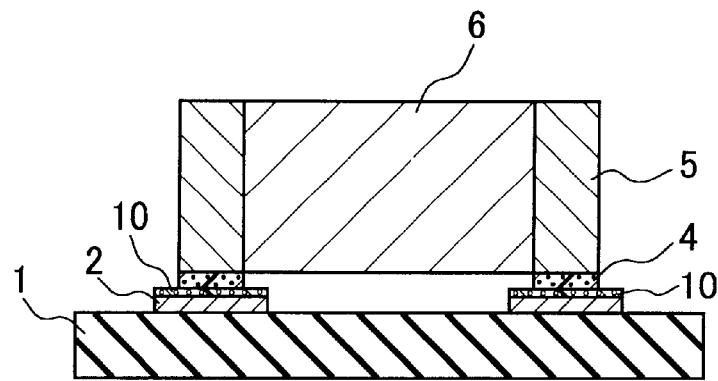
FIG. 5 shows a cross-section of the electronic component mounted member according to Example 3.

The electrically conductive adhesive 4 used in this example was the same as that in Example 1. As shown in FIG. 5, the prepared chip resistor 6 was mounted on the circuit board 1 using the electrically conductive adhesive 4 and cured in an oven at 150° C. for one hour. The repair characteristics of this electronic component mounted member were evaluated.

Also, as Reference example 3, the intermediate layer 3 of Example 1 was used for comparison. Regarding the evaluated items and the evaluation method, in addition to the items evaluated in Example 1, the connection resistance of evaluated samples also was measured, which indicated an effect of reducing the connection resistance expected in the present invention. The results of these measurements are shown in Table 3.

TABLE 3

| Intermediate layer specification | Surface condition after component removal | | Component removal load (N) | Connection resistance before repairing (mΩ) |
|---|---|---|---|---|
| | Adhesive residue | Electrode damage | | |
| (Example 3) Acrylic resin | None | None | 8.9 | 12.3 |

TABLE 3-continued

| Intermediate layer specification | Surface condition after component removal | | Component removal load (N) | Connection resistance before repairing (mΩ) |
|---|---|---|---|---|
| | Adhesive residue | Electrode damage | | |
| 5 µm + expandable particle (Reference example 3) Acrylic resin 5 µm | None | None | 8.5 | 35.1 |

As shown in Table 3, in the example of the present invention, it became possible to achieve an excellent repair and to reduce the connection resistance of the component in a normal state, i.e., in the completed form as the mounted substrate.

In the examples of the present invention described above, the electronic component was the chip resistor. However, it is not limited to the above as long as it is a commonly-used electronic component such as a semiconductor package and a connector.

Although the intermediate layer was formed on the surface of the circuit board electrode in the above examples, it may be formed on the surface of the electronic component in the present invention. Also, the intermediate layer may be formed on the surface of an anisotropic conductive film (ACF) so as to be used for the connection of the electronic component.

As described above, in the present invention, the intermediate layer with a specific melting point is formed on a joining interface of the electronic component and the circuit board, thus making it possible to improve repair characteristics of the electronic components practically, which conventionally have been a problem in the connection with the electrically conductive adhesive.

In addition, the present invention can achieve the electronic component and the electronic component mounted member using no lead. This also is appropriate for responding to environmental issues, which have attracted wide attention recently.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. An electronic component mounted member comprising:
  a circuit board;
  an electronic component connected to the circuit board; and
  an electrically conductive adhesive interposed between the electronic component and the circuit board;
  wherein, in a joining interface of the electrically conductive adhesive and an electrode of the circuit board, an intermediate layer that is formed of a thermoplastic insulating adhesive with a softening temperature of 100° C. to 300° C. is interposed between the electrically conductive adhesive and the electrode, and an electrically conductive filler contained in the electrically conductive adhesive is present partially in the intermediate layer, thus allowing an electrical conduction between the electrically conductive adhesive and the electrode of the circuit board.

2. The electronic component mounted member according to claim 1, wherein the electronic component and the circuit board further are adhered to each other by an insulating adhesive in a portion other than the electrode of the circuit board, and the intermediate layer also is provided between the insulating adhesive and the circuit board.

3. The electronic component mounted member according to claim 1, wherein an area where the intermediate layer is formed is not smaller than that where the electrically conductive adhesive is formed.

4. The electronic component mounted member according to claim 3, wherein the area where the intermediate layer is formed is one to two times as large as that where the electrically conductive adhesive is formed.

5. The electronic component mounted member according to claim 4, wherein the area where the intermediate layer is formed is 1.1 times to 1.5 times as large as that where the electrically conductive adhesive is formed.

6. The electronic component mounted member according to claim 1, wherein the thermoplastic insulating adhesive has a softening temperature of equal to or lower than 250° C.

7. The electronic component mounted member according to claim 1, wherein, in a joining portion of the electrically conductive adhesive and the electrode of the circuit board, the intermediate layer has a thickness of 0.05 µm to 10 µm.

8. An electronic component mounted member comprising:
  a circuit board;
  an electronic component connected to the circuit board; and
  an electrically conductive adhesive interposed between the electronic component and the circuit board;
  wherein, in a joining interface of the electrically conductive adhesive and an electrode of the circuit board, an intermediate layer that is formed of a thermoplastic insulating adhesive with a softening temperature of 100° C. to 300° C. and contains an electrically conductive expandable particle is interposed between the electrically conductive adhesive and the electrode, and the electrically conductive expandable particle allows an electrical conduction between the electrically conductive adhesive and the electrode of the circuit board.

9. The electronic component mounted member according to claim 8, wherein an area where the intermediate layer is formed is not smaller than that where the electrically conductive adhesive is formed.

10. The electronic component mounted member according to claim 8, wherein the thermoplastic insulating adhesive has a softening temperature of equal to or lower than 250° C.

11. The electronic component mounted member according to claim 8, wherein, in a joining portion of the electrically conductive adhesive and the electrode of the circuit board, the intermediate layer has a thickness of 0.05 µm to 10 µm.

12. The electronic component mounted member according to claim 8, wherein a content of the electrically conductive expandable particle is from 2 vol % to 50 vol %.

13. The electronic component mounted member according to claim 8, wherein the electrically conductive expandable particle has a mean particle diameter of 1 µm to 10 µm.

14. The electronic component mounted member according to claim 8, wherein the electrically conductive expandable particle comprises an expandable resin particle whose surface is coated with an electrically conductive metal.

15. The electronic component mounted member according to claim 8, wherein the electrically conductive expandable particle has an expansion temperature ranging from 100° C. to 300° C.

* * * * *

UNITED STATES PATENT AND TRADEMARK OFFICE
CERTIFICATE OF CORRECTION

PATENT NO.   : 6,512,183 B2
DATED        : January 28, 2003
INVENTOR(S)  : Mitani et al.

It is certified that error appears in the above-identified patent and that said Letters Patent is hereby corrected as shown below:

<u>Title page,</u>
Item [56], References Cited, FOREIGN PATENT DOCUMENTS,
"JP  2-182050   7/1990" should read -- JP  2-185050  7/1990 --

Signed and Sealed this

Twenty-seventh Day of January, 2004

JON W. DUDAS
*Acting Director of the United States Patent and Trademark Office*